US006751760B2

(12) United States Patent
Tseng et al.

(10) Patent No.: US 6,751,760 B2
(45) Date of Patent: Jun. 15, 2004

(54) METHOD AND SYSTEM FOR PERFORMING MEMORY REPAIR ANALYSIS

(75) Inventors: Yuan-Ping Tseng, Hsinchu (TW); Vincent Wang, Jubei (TW); Linck Cheng, Taichung (TW); An-Hong Liu, Tainan (TW)

(73) Assignee: ChipMOS Technologies Inc., Hsinchu (TW)

( * ) Notice: Subject to any disclaimer, the term of this patent is extended or adjusted under 35 U.S.C. 154(b) by 386 days.

(21) Appl. No.: 09/988,518

(22) Filed: Nov. 20, 2001

(65) Prior Publication Data

US 2003/0097626 A1 May 22, 2003

(51) Int. Cl.$^7$ .............................................. G11C 29/00
(52) U.S. Cl. ...................................... 714/710; 714/718
(58) Field of Search ................................ 714/720, 704, 714/710, 718; 701/35; 365/201; 702/84, 82

(56) References Cited

U.S. PATENT DOCUMENTS

| 4,958,346 | A | * | 9/1990 | Fujisaki ....................... 714/720 |
| 5,111,402 | A | * | 5/1992 | Brooks et al. ................. 701/35 |
| 5,410,687 | A | * | 4/1995 | Fujisaki et al. ............. 365/201 |
| 5,841,783 | A |   | 11/1998 | Suzuki et al. ................ 371/5.1 |
| 5,983,372 | A | * | 11/1999 | Fujiwara ..................... 714/704 |
| 6,618,682 | B2 | * | 9/2003 | Bulaga et al. ................ 702/84 |
| 6,678,623 | B2 | * | 1/2004 | Koyama ....................... 702/82 |

* cited by examiner

Primary Examiner—David Ton
(74) Attorney, Agent, or Firm—Troxell Law Office PLLC

(57) ABSTRACT

A method and a system for performing memory repair analysis are provided. A merge circuit is connected between test storage device of semiconductor testing equipment and pre-analysis storage device of repair analysis apparatus. Prior to memory repair analysis process, data from a plurality of functional tests are merged as a functional test data with addresses of fail bits by the merge circuit, then stored in pre-analysis storage device for analyzing. Therefore, test time is reduced and test efficiency is improved.

8 Claims, 3 Drawing Sheets

METHOD AND SYSTEM FOR PERFORMING MEMORY REPAIR ANALYSIS

FIELD OF THE INVENTION

The present invention relates to a memory repair analysis (MRA) system and a method for performing memory repair analysis, particularly to a method for testing and repair analyzing semiconductor memories by using a merge circuit.

BACKGROUND OF THE INVENTION

Conventionally, memories such as dynamic random access memory (DRAM), static random access memory (SRAM), flash memory, double data rate DRAM (DDR DRAM), or system of chip (SOC) including memories are made by semiconductor manufacturing processes. For example, a plurality of DRAM memory dies (the number is from hundreds to few thousands) are formed on a wafer with integrated circuits, such as a wafer of 6 inches, 8 inches, or 12 inches. However, according to small-sized and complicated trends of electronic elements, and advanced manufacturing technique, memory capacity is synchronously increased, such as familiar DRAM of 4 Mb or 16 Mb has been increased up to DRAM of 64 Mb, 128 Mb or 256 Mb, even DDR DRAM.

When memory capacity becomes bigger and bigger, it is inevitable that the possibility of generating fail memory cells in the semiconductor manufacture becomes higher. Yield of good known dies would decrease on a wafer as the number of fail memory devices increases. Therefore, memory device has not only a memory region of normally grouping rows and columns, but also a redundancy circuit (or called redundancy cells). The fail memory cells in the normal region are replaced by redundancy cell by using the technique of laser repair to change electric circuit paths for enhancing product yield.

For the semiconductor manufacturing process of memories, the technique of memory repair analysis (MRA) has to be used in testing and repairing (laser or high voltage melting) operations. The MRA process is performed in order to repair memory cells properly, includes: taking the information of location and counting of fail cells by testing, analyzing and identifying if the fail cells are repairable or not and how to replace if they are repairable in order to proceed next repairing processes.

U.S. Pat. No. 5,841,783 entitled "Fail Address Analysis And Repair System For Semiconductor Test" has disclosed a memory repair analysis system. As shown in FIG. 1,. the system comprises a semiconductor testing equipment 150, a repair address analysis apparatus 160, and a testing equipment control unit 170. Testing equipment control unit 170 serves as a control interface between semiconductor testing equipment 150 and repair address analysis apparatus 160. Semiconductor testing equipment 150 includes a fail memory 151 for storing fail bits information of a memory device and a control unit 152 for controlling fail memory 151. Repair address analysis apparatus 160 includes a fail buffer memory 161 for storing the information transferred from fail memory 151 to repair address analysis apparatus 160, a fail count unit 162 for analyzing the information in fail buffer memory 161 to be repair information, and a control unit 163 for controlling fail buffer memory 161 and fail count unit 162.

In the familiar memory repair analysis system mentioned above, when a fail bit is identified in a memory device by semiconductor testing equipment 150, the information of a fail bit will be stored into fail memory 151 by control unit 152. Then, before proceeding next functional test by semiconductor testing equipment 150, the information stored in fail memory 151 must be transferred and stored into fail buffer memory 161 of repair address analysis apparatus 160. However, with skilled and complicated trends of memory devices, a memory device needs to be executed for multiple and different functional tests. It is necessary to transfer the data of fail bit from fail memory 151 of semiconductor testing equipment 150 into fail buffer memory 161 of repair address analysis apparatus 160 after each functional test, then performing a long-time and improper memory repair analysis (MRA). Besides, semiconductor testing equipment 150 must wait to transfer data of fail bit until repair address analysis apparatus 160 finishes analyzing operation, so that it will cause a slow testing speed. It is a waste of time operating several memory repair analysis (MRA) processes for each memory device, so that it is not efficient and economic for very expensive testing and repair analysis facilities.

SUMMARY

It is a main object of the present invention to provide a method for testing and repair analyzing semiconductor memories to collect and merge the multiple functional test data of a memory into a merged functional test data of fail bits by using a merge circuit. Then, repair analysis processes would be continued for shortening test time and enhancing test efficiency.

It is another object of the present invention to provide a memory repair analysis system having a merge circuit to collect and merge the address information of fail bits from multiple functional tests executed by a semiconductor testing equipment, and transmit the merged information to a repair address analysis apparatus.

In order to attain the object described above, according to the present invention, multiple functional tests are executed on a memory to obtain the data with addresses of fail bits after each functional test. The data with addresses of fail bits in each functional test are compared with the merged data with addresses of fail bits obtained from previous functional tests and both of two data further is merged. A repair analyzing operation is executed according to the merged data with addresses of fail bits to determine if the memory is repairable and how to repair repairable memory by redundancy circuit.

DETAILED DESCRIPTION OF THE PRESENT INVENTION

Figure 1:
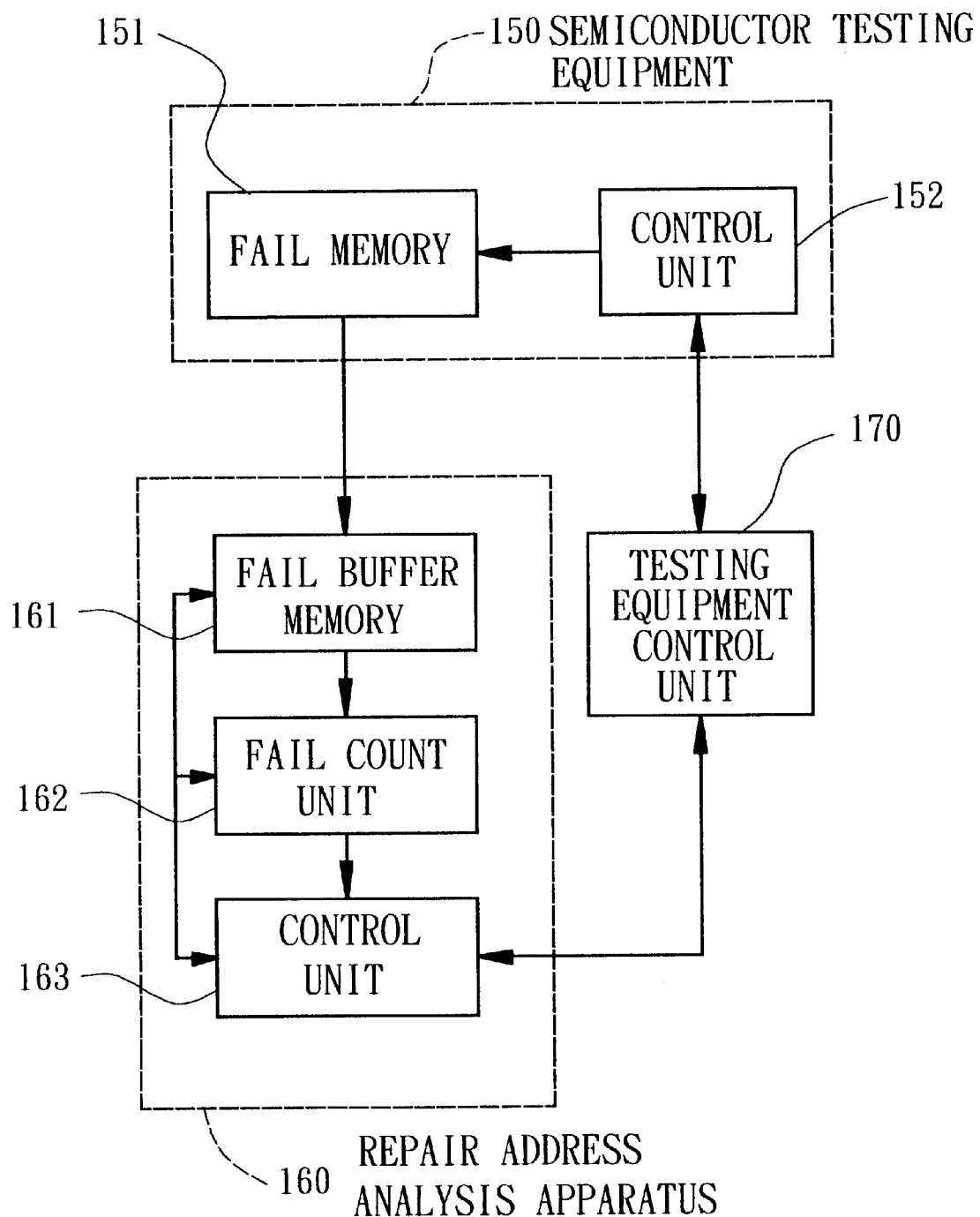
FIG. 1 is a block diagram showing the memory repair analysis system disclosed in U.S. Pat. No. 5,841,783 "fail address analysis and repair system for semiconductor test"

Referring to the drawings attached, the present invention will be described by means of the embodiments below.

Figure 2:
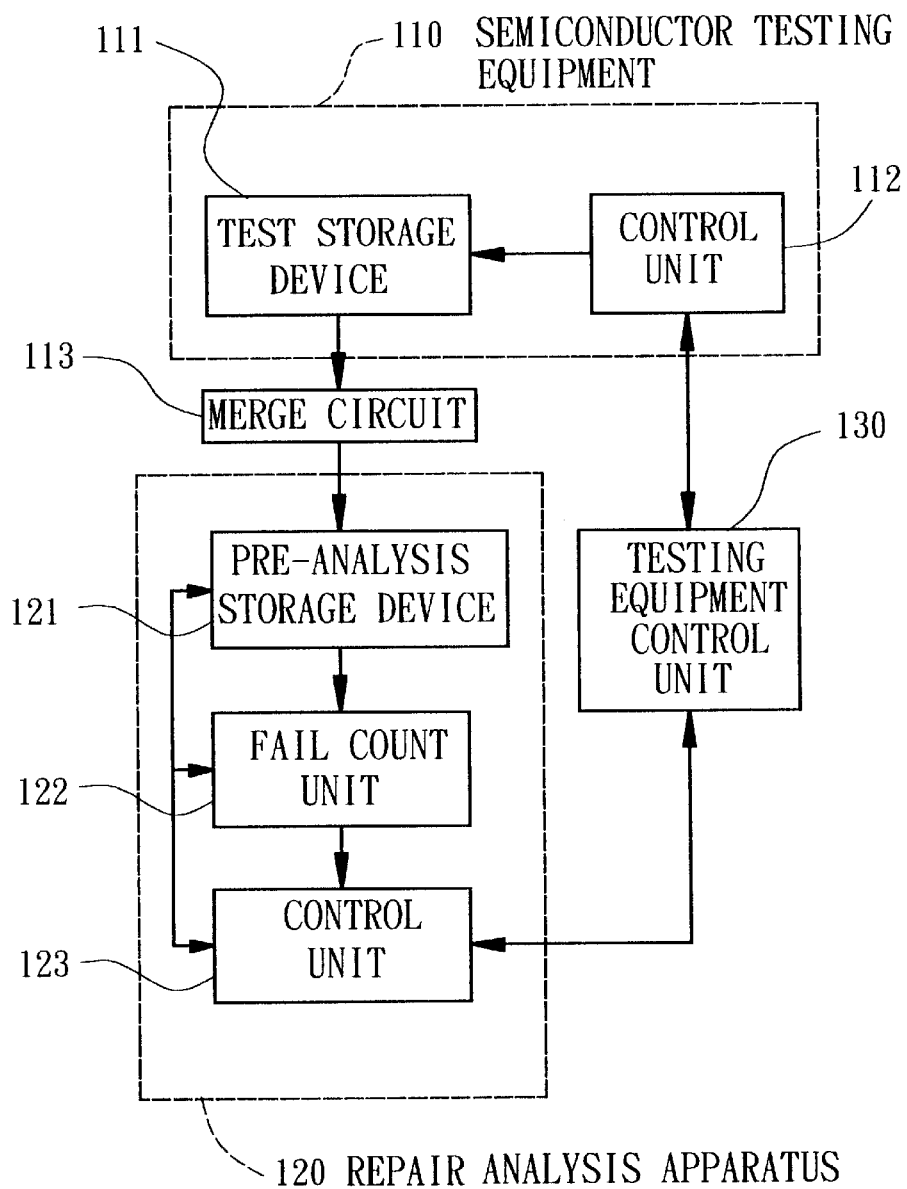
FIG. 2 is a block diagram showing a memory repair analysis system according to the present invention.

As shown in FIG. 2, a memory repair analysis system according to the present invention comprises a semiconductor testing equipment 110, a repair analysis apparatus 120, a testing equipment control unit 130, and a merge circuit 113. Testing equipment control unit 130 serves as a control interface between semiconductor testing equipment 110 and repair analysis apparatus 120. Semiconductor testing equipment 110 is used for testing one kind of semiconductor memory device such as dynamic random access memory (DRAM), static random access memory (SRAM), flash memory, double data rate DRAM (DDA DRAM), or system-on-chip (SOC) including memory. Semiconductor testing equipment 110 includes a test workstation (not shown in the drawing) that has a test head mounting a probe card to contact memories on a wafer, a test storage device 111 for storing test data, and a control unit 112 for controlling the test storage device 111.

Repair analysis apparatus 120 comprises a pre-analysis storage device 121, a fail count unit 122, and a control unit 123. Pre-analysis storage device 121 is used to store the test data transferred from test storage device 111 through merge circuit 113. The test data has to be compared and merged by merge circuit 113 before storing into pre-analysis storage device 121. Generally, the capacity of pre-analysis storage device 121 is much larger than the capacity of test storage device 111. Fail count unit 122 is installed for the purpose of analyzing the test data stored in the pre-analysis storage device 121 for determining if memory is repairable and translating into a useful data file how to repair the repairable memory by redundancy circuits. Control unit 123 serves for controlling pre-analysis storage device 121 and fail count unit 122. In some case, repair analysis apparatus 120 may be assembled inside the semiconductor testing equipment 110 to form an integrated test apparatus, or repair analysis apparatus 120 is a separate equipment electrically connecting with semiconductor testing equipment 110.

Figure 3:
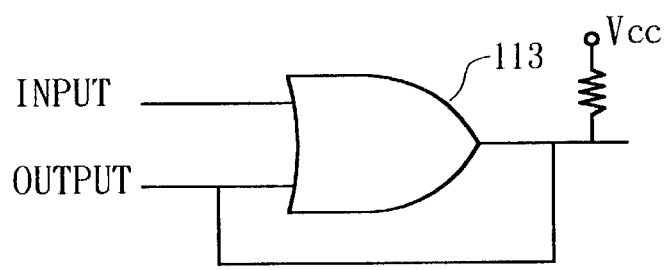
FIG. 3 is a diagrammatic view illustrating the merge circuit in the memory repair analysis system of the present invention.

Merge circuit 113 is connected with the test storage device 111 and the re-analysis storage device 121 for comparing and merging the test data which is transferred from test storage device 111. The merge circuit 113 is shown in FIG. 3, it is possessed of comparing and filtering. It is better for the merge circuit 113 to be set inside the semiconductor testing equipment 110.

Figure 4:
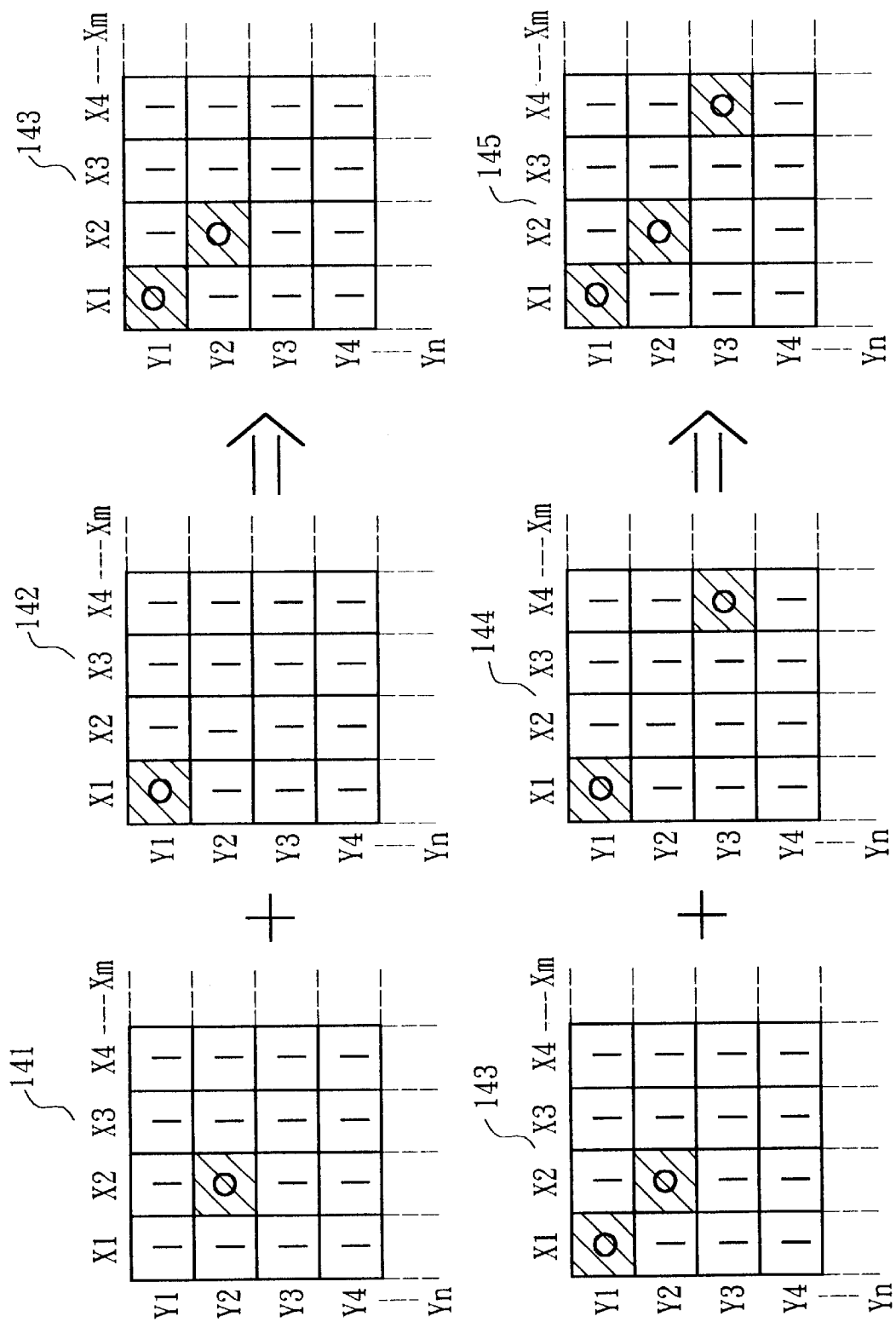
FIG. 4 is a diagrammatic view illustrating a process of comparison and mergence of the data with addresses of fail bits from multiple functional tests in accordance with the present invention.

When a plurality of memories such as 64 Mb DRAM on a wafer are tested by the memory repair analysis system mentioned above, due to different customer requirements or product characteristics, each memory must be tested through multiple items of functional tests that is tested under different testing conditions or programs (such as different voltages or burn-in state). Generally, the semiconductor testing equipment 110 may contact and test a plurality of memories simultaneously (the number is about 10 to 50). As shown in FIG. 4, a memory as an example will be presented to explain here. The data obtained after performing first item functional test will be represented with a drawing number 141, wherein "1" means a good bit, "0" means a defective bit or fail bit. There is a fail bit that is found at the location of X2 row, Y2 column in the memory under first item test, then the data 141 with address (X2–Y2) of the fail bit is stored into test storage device 111. The data obtained after performing the second item functional test will be represented with a drawing number 142. There is a fail bit that is found at the location of X1 row, Y1 column in the same memory under second item test. The data 141 with address (X2–Y2) under the first item functional test would be stored into pre-analysis storage device 121 passing through merge circuit 113 before storing the data 142 with address (X1–Y1) of the fail bit under the second item functional test into the test storage device 111. Then, the data obtained after performing the third item functional test will be represented with a drawing number 144. There are two fail bits that are found at the locations of X1 row, Y1 column Y1 and X4 row, Y3 column in the same memory under third item test. Before the addresses (X1–Y1, X4–Y3) of the fail bits in the memory under third item functional test being stored into the test storage device 111, data 142 with fail bit (X1–Y1) under second item functional test would be merged and stored into pre-analysis storage device 121 by passing through merge circuit 113. The merge circuit 113 compares data 141 of first item functional test and data 142 of second item functional test, and filters useless data to form an integrated test data 143 (X1–Y1, X2–Y2) by merging the functional test data 141,142 of first item and second item. If there are three items of functional tests that are necessary for this memory here, an ending signal will be sent out from testing equipment control unit 130 for driving the third item functional test data 144 (X1–Y1, X4–Y3) to compare with the merged functional test data 143 (X1–Y1, X2–Y2) of first item and second item by the merge circuit 113. Thus, an integrated functional test data 145 (X1–Y1, X2–Y2, X4–Y3) of merging the first, second, and third item functional test data is stored into pre-analysis storage device 121. Finally, fail count unit 122 analyzes the merged functional test data 145 to determine if the memory is repairable or not and obtain the information that how to repair repairable memory with redundancy circuit for next laser-repairing process. In addition, it is better that the redundancy circuits in the memory should be tested simultaneously in the functional test steps of each time to grasp bit conditions of the redundancy circuits in the memory.

Therefore, according to the present invention, the data obtained from multiple times of functional tests are merged as an effective data. Only a pre-analysis storage device 121 with little capacity is required during the testing processes of complicated and high-capacity memories. It is unnecessary to execute memory repair analysis after each functional test, so that the waiting time of memory repair analysis for semiconductor testing equipment can be saved to shorten testing time and enhance testing efficiency.

The above description of embodiments of this invention is intended to be illustrative and not limiting. Other embodiments of this invention will be obvious to those skilled in the art in view of the above disclosure.

What is claimed is:

1. A method for performing memory repair analysis comprising the steps of:
   executing multiple times of functional tests on at least a memory, wherein the data with addresses of fail bits are obtained after each functional test;
   comparing the data with addresses of fail bits obtained from each functional test with the merged data with addresses of fail bits combined from previous functional tests, and merging both of two data; and
   analyzing the memory by the merged data with addresses of fail bits from the functional tests to determine if the memory is repairable and how to repair repairable memory with redundancy circuits.

2. The method for performing memory repair analysis in accordance with claim 1, wherein the redundancy circuits in the memory are tested simultaneously in the each functional test.

3. The method for performing memory repair analysis in accordance with claim 1, wherein a plurality of memories are tested simultaneously in each functional test.

4. A memory repair analysis system comprising:

a semiconductor testing equipment including a test storage device for storing the test data;

a repair analysis apparatus including a pre-analysis storage device for storing the data transferred from the test storage device of the semiconductor testing equipment;

a testing equipment control unit serving as a control interface between the semiconductor testing equipment and the repair analysis apparatus; and a merge circuit connecting between the test storage device and the analysis repair device to compare and merge the test data prior to transfering into the pre-analysis storage device.

5. The memory repair analysis system in accordance with claim 4, wherein the merge circuit is set inside the semiconductor testing equipment.

6. The memory repair analysis system in accordance with claim 4, wherein the repair analysis apparatus is integrated with the semiconductor testing equipment.

7. The memory repair analysis system in accordance with claim 4, wherein the test storage device stores the data with addresses of fail bits of the tested memory.

8. The memory repair analysis system in accordance with claim 4, wherein the capacity of the pre-analysis storage device is larger than the capacity of the test storage device.

* * * * *